(12) United States Patent
Kimura et al.

(10) Patent No.: US 9,368,712 B2
(45) Date of Patent: Jun. 14, 2016

(54) SURFACE ACOUSTIC WAVE DEVICE

(71) Applicant: Murata Manufacturing Co., Ltd., Nagaokakyo-shi, Kyoto-fu (JP)

(72) Inventors: Tetsuya Kimura, Nagaokakyo (JP); Yasuyuki Ida, Nagaokakyo (JP); Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 831 days.

(21) Appl. No.: 13/674,114

(22) Filed: Nov. 12, 2012

(65) Prior Publication Data

US 2013/0069481 A1 Mar. 21, 2013

Related U.S. Application Data

(63) Continuation of application No. PCT/JP2011/060372, filed on Apr. 28, 2011.

(30) Foreign Application Priority Data

May 19, 2010 (JP) .................................. 2010-115171

(51) Int. Cl.
*H03H 9/145* (2006.01)
*H01L 41/107* (2006.01)

(52) U.S. Cl.
CPC ......... *H01L 41/107* (2013.01); *H03H 9/14541* (2013.01)

(58) Field of Classification Search
CPC ................. H03H 9/02653; H03H 9/14541
USPC ............................................. 310/313
See application file for complete search history.

(56) References Cited

U.S. PATENT DOCUMENTS

| 8,587,179 B2* | 11/2013 | Yaoi ..................... H03H 9/0222 |
| | | 310/313 A |
| 9,088,263 B2* | 7/2015 | Yamanaka ......... H03H 9/02551 |
| | | 310/313 A |
| 9,184,367 B2* | 11/2015 | Sakaguchi ........... H03H 9/0222 |
| 2004/0070313 A1 | 4/2004 | Furukawa et al. |
| 2009/0121584 A1 | 5/2009 | Nishimura et al. |
| 2011/0133600 A1 | 6/2011 | Kimura et al. |
| 2012/0262028 A1* | 10/2012 | Yamane .............. H03H 9/0222 |
| | | 310/313 C |

(Continued)

FOREIGN PATENT DOCUMENTS

| JP | 3-217109 A | 9/1991 |
| JP | 09-083030 A | 3/1997 |

(Continued)

OTHER PUBLICATIONS

Official Communication issued in corresponding Japanese Patent Application No. 2012-515808, mailed on Feb. 12, 2014.

(Continued)

*Primary Examiner* — J. San Martin
(74) *Attorney, Agent, or Firm* — Keating & Bennett, LLP

(57) ABSTRACT

A surface acoustic wave device includes a piezoelectric substrate including a groove located in a surface thereof, an IDT electrode, and a dielectric film. The IDT electrode includes a first electrode layer located in the groove and a second electrode layer located outside the groove. The dielectric film is arranged on the piezoelectric substrate so as to cover the IDT electrode. The second electrode layer is tapered toward a side opposite to the piezoelectric substrate.

5 Claims, 2 Drawing Sheets

(56) References Cited

U.S. PATENT DOCUMENTS

| | | | | |
|---|---|---|---|---|
| 2013/0300253 A1* | 11/2013 | Kimura | ............ | H03H 9/02818 310/313 A |
| 2014/0055207 A1* | 2/2014 | Owaki | ............ | H03H 9/02551 331/163 |

FOREIGN PATENT DOCUMENTS

| | | |
|---|---|---|
| JP | 2001-168671 A | 6/2001 |
| JP | 2002-217672 A | 8/2002 |
| JP | 2006-186623 A | 7/2006 |
| JP | 2006-270906 A | 10/2006 |
| JP | 2007-282294 A | 10/2007 |
| JP | 2007-336417 A | 12/2007 |
| WO | 03/058813 A1 | 7/2003 |
| WO | 2010/016192 A1 | 2/2010 |

OTHER PUBLICATIONS

Official Communication issued in International Patent Application No. PCT/JP2011/060372, mailed on Jul. 19, 2011.

\* cited by examiner

SURFACE ACOUSTIC WAVE DEVICE

BACKGROUND OF THE INVENTION

1. Field of the Invention

The present invention relates to a surface acoustic wave device. In particular, the present invention relates to a surface acoustic wave device including an IDT electrode of which a portion is embedded in a groove located in a piezoelectric substrate and a dielectric film arranged so as to cover the IDT electrode.

2. Description of the Related Art

In recent years, surface acoustic wave devices such as surface acoustic wave resonators and surface acoustic wave filters which utilize surface acoustic waves have been widely used.

A surface acoustic wave device includes a piezoelectric substrate and an IDT electrode formed on the piezoelectric substrate. In the surface acoustic wave device, an elastic wave excited by the IDT electrode propagates as a surface acoustic wave on the surface of the piezoelectric substrate.

In the surface acoustic wave device, a $LiNbO_3$ substrate, a $LiTaO_3$ substrate, or the like is generally used as the piezoelectric substrate. The $LiNbO_3$ substrate and $LiTaO_3$ substrate have negative temperature coefficients of frequency (TCF). Thus, when the $LiNbO_3$ substrate or the $LiTaO_3$ substrate is used as the piezoelectric substrate, the frequency characteristics of the surface acoustic wave device change with temperature change. In view of this, for example, WO 2010/016192A1 described below states that a portion of an IDT electrode is embedded in a groove formed on a piezoelectric substrate and a $SiO_2$ film having a positive TCF is further formed so as to cover the IDT electrode, thereby reducing the temperature dependency of the frequency characteristics of a surface acoustic wave device.

In addition, in a surface acoustic wave device, a dielectric film may be formed on a piezoelectric substrate so as to cover an IDT electrode, for the purpose of improving voltage resistance and other purposes unlike improvement of frequency-temperature characteristics as described above.

However, when a dielectric film is formed on a piezoelectric substrate so as to cover an IDT electrode, favorable frequency characteristics may not be obtained.

SUMMARY OF THE INVENTION

Accordingly, preferred embodiments of the present invention improve frequency characteristics such as resonant characteristics and filter characteristics in a surface acoustic wave device which includes a dielectric film arranged on a piezoelectric substrate so as to cover an IDT electrode.

As a result of thorough research, the inventors of the present invention have discovered that the cause for deterioration of frequency characteristics when a dielectric film is formed is that a gap is formed between the dielectric film and an IDT electrode. Preferred embodiments of the present invention were developed based on this discovery.

A surface acoustic wave device according to a preferred embodiment of the present invention includes a piezoelectric substrate, an IDT electrode, and a dielectric film. On a surface of the piezoelectric substrate, a groove is formed. The IDT electrode includes a first electrode layer located in the groove and a second electrode layer located outside the groove. The dielectric film is arranged on the piezoelectric substrate so as to cover the IDT electrode. The second electrode layer is tapered toward a side opposite to the piezoelectric substrate.

In a specific aspect of the surface acoustic wave device according to a preferred embodiment of the present invention, the first electrode layer is tapered toward the piezoelectric substrate side.

In another specific aspect of the surface acoustic wave device according to a preferred embodiment of the present invention, a cross-sectional shape of the second electrode layer is trapezoidal. A ratio (T/R) of a length (T) of an upper base to a length (R) of a lower base in a cross section of the second electrode layer is preferably within a range of about 0.8 to about 0.99, for example. According to this configuration, frequency characteristics such as resonant characteristics and filter characteristics can be further improved.

In a preferred embodiment of the present invention, the "trapezoidal shape" includes a shape in which at least some of an upper base, a lower base, and sides are formed as curves, and a trapezoidal shape in which corners are chamfered or round-chamfered.

In another specific aspect of the surface acoustic wave device according to a preferred embodiment of the present invention, a ratio (HT/R) of a height (HT) to the length (R) of the lower base in the cross section of the second electrode layer preferably is within a range of about 0.1 to about 0.25, for example. According to this configuration, frequency characteristics such as resonant characteristics and filter characteristics can be further improved.

In still another specific aspect of the surface acoustic wave device according to a preferred embodiment of the present invention, the dielectric film is made from silicon oxide or silicon nitride.

In a preferred embodiment of the present invention, the second electrode layer of the IDT electrode which is located outside the groove is tapered toward the side opposite to the piezoelectric substrate. Thus, the occurrence of a gap between the IDT electrode and the dielectric film is prevented. Therefore, scattering of surface acoustic waves and the like can be prevented. In addition, an effect of improving voltage resistance and frequency-temperature characteristics by forming the dielectric film is sufficiently obtained. As a result, high-quality frequency characteristics of the surface acoustic wave device can be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with, an example, a surface acoustic wave device 1 shown in FIGS. 1 and 2 which preferably is a surface acoustic wave resonator. It is noted that the surface acoustic wave device 1 is merely illustrative. The surface acoustic wave device according to the present invention is not limited to the surface acoustic wave device 1 in any way. The surface acoustic wave device according to a preferred embodiment of the present invention may be, for example, a surface acoustic wave filter device.

Figure 1:
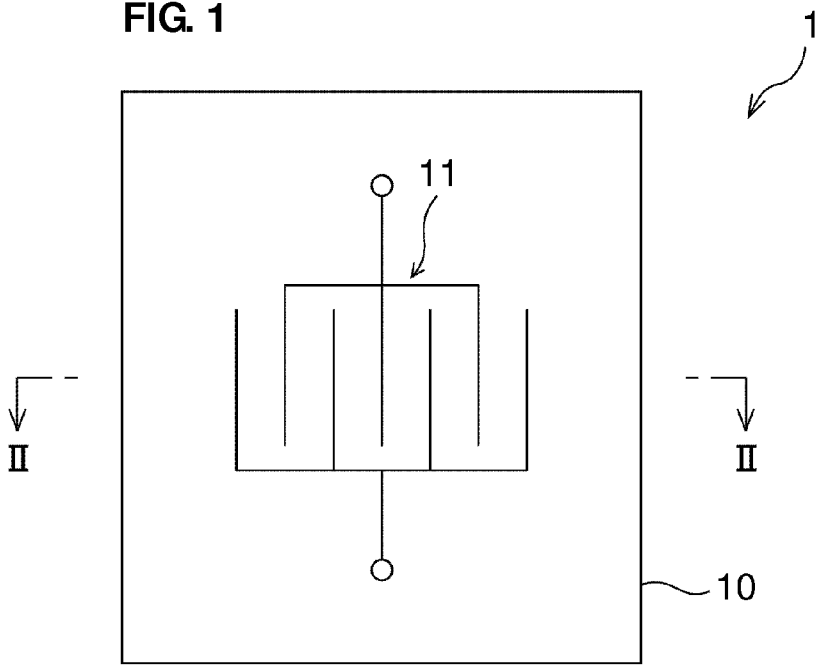
FIG. 1 is a schematic plan view of a surface acoustic wave device according to a preferred embodiment of the present invention.

FIG. 1 is a schematic plan view of the surface acoustic wave device according to the present preferred embodiment. FIG. 2 is a schematic cross-sectional view of the surface acoustic wave device according to the present preferred embodiment. It is noted that in FIG. 1, drawing of a dielectric film 12 is omitted for convenience of drawing.

Figure 2:
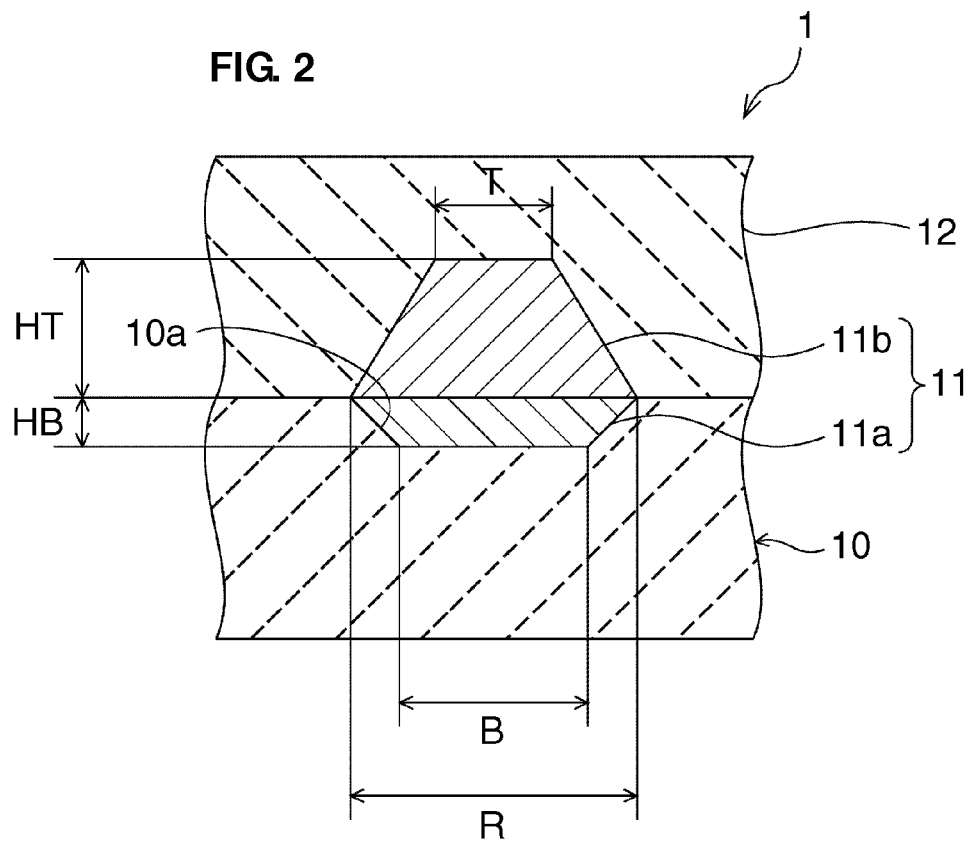
FIG. 2 is a schematic cross-sectional view of the surface acoustic wave device according to a preferred embodiment of the present invention.

As shown in FIGS. 1 and 2, the surface acoustic wave device 1 includes a piezoelectric substrate 10. The piezoelectric substrate 10 can be made of an appropriate piezoelectric material. The piezoelectric substrate 10 can be made of, for example, LiNbO$_3$, LiTaO$_3$, ZnO, crystal, or the like.

An IDT electrode 11 is located on the piezoelectric substrate 10 and includes a pair of comb electrodes which are inserted into each other. In the surface acoustic wave device 1, an elastic wave excited by the IDT electrode 11 propagates as a surface acoustic wave on the surface of the piezoelectric substrate 10 such that the function of the surface acoustic wave device 1 is achieved.

The dielectric film 12 is arranged on the piezoelectric substrate 10 so as to cover the IDT electrode 11. In the present preferred embodiment, the dielectric film 12 is provided, for example, to protect the surface of the piezoelectric substrate 10 on which the IDT electrode 11 is provided, and to improve the voltage resistance and the frequency-temperature characteristics of the surface acoustic wave device 1. It is noted that when improvement of the frequency-temperature characteristics is attempted, the dielectric film 12 is preferably made of a material having a TCF of which the sign, or polarity is different from that of the piezoelectric substrate 10 or a material having a TCF of which the sign is the same as that of the piezoelectric substrate 10 and of which the absolute value is lower than that of the piezoelectric substrate 10. For example, when the piezoelectric substrate 10 is preferably made of a material having a negative TCF such as LiNbO$_3$ or LiTaO$_3$, the dielectric film 12 is preferably made of silicon oxide such as SiO$_2$, silicon nitride such as SiN, or the like.

The thickness of the dielectric film 12 is not particularly limited as long as it is such a thickness that an elastic wave excited by the IDT electrode 11 is a surface acoustic wave. The thickness of the dielectric film 12 can be, for example, about 0.01λ to about 0.3λ (λ is the wavelength of the surface acoustic wave).

In addition, the dielectric film 12 may be a laminate of a plurality of dielectric films. For example, the dielectric film 12 may be a laminate of a silicon oxide film and a silicon nitride film.

The method of forming the dielectric film 12 is not particularly limited. The dielectric film 12 can be formed by an appropriate film formation method such as sputtering or CVD (Chemical Vapor Deposition).

As shown in FIG. 2, in the present preferred embodiment, the IDT electrode 11 is preferably a laminate of a first electrode layer 11a and a second electrode layer 11b. Each of the first and second electrode layers 11a and 11b can be made of an appropriate conductive material. Each of the first and second electrode layers 11a and 11b can be made of, for example, a metal selected from the group consisting of Al, Pt, Au, Ag, Cu, Ti, Ni, and Pd or an alloy including one or more metals selected from the group consisting of Al, Pt, Au, Ag, Cu, Ti, Ni, and Pd. In addition, each of the first and second electrode layers 11a and 11b may be a laminate of a plurality of conductive layers each formed from the above metal or alloy. The first and second electrode layers 11a and 11b may be made of the same material or different materials.

The first electrode layer 11a is located in a groove 10a provided in the surface of the piezoelectric substrate 10. The first electrode layer 11a is tapered toward the piezoelectric substrate 10 side. Specifically, the first electrode layer 11a preferably has a trapezoidal shape in cross section. Thus, for example, as compared to the case where the first electrode layer 11a preferably has a rectangular or substantially rectangular shape in cross section, a gap is unlikely to be formed between the piezoelectric substrate 10 and the first electrode layer 11a. Therefore, for example, scattering of surface acoustic waves can be effectively prevented.

The ratio (B/R) of the length B of an upper base of the first electrode layer 11a to the length R of a lower base thereof is, for example, preferably about 0.5 to about 0.98, more preferably about 0.56 to about 0.98, and even more preferably about 0.7 to about 0.95. If the ratio (B/R) is too high, a gap may occur between a side surface of the groove 10a and the first electrode layer 11a. If the ratio (B/R) is too low, the cross-sectional area of each electrode finger constituting the IDT electrode 11 is made small and thus the resistance of each electrode finger may be increased. The ratio (HB/R) of the height HB of the first electrode layer 11a to the length R of the lower base thereof is, for example, preferably about 0.02 to about 0.3 and more preferably about 0.02 to about 0.25. If the ratio (HB/R) is too high, it may be difficult to form the groove 10a. If the ratio (HB/R) is too low, the effect of embedding a portion of the IDT electrode 11 in the groove 10a may not be obtained.

The second electrode layer 11b is provided on the first electrode layer 11a. The second electrode layer 11b is located outside the groove 10a. The second electrode layer 11b is tapered toward a side opposite to the piezoelectric substrate 10. Specifically, the second electrode layer 11b preferably has a trapezoidal shape in cross section.

The length of a lower base of the second electrode layer 11b preferably is equal or substantially equal to the length of the lower base of the first electrode layer 11a and is R. The ratio (T/R) of the length T of an upper base of the second electrode layer 11b to the length of the lower base R thereof is, for example, preferably about 0.8 to about 0.99 and more preferably about 0.86 to about 0.98. If the ratio (T/R) is too high, a gap may occur between the second electrode layer 11b and the dielectric film 12. If the ratio (T/R) is too low, the cross-sectional area of each electrode finger constituting the IDT electrode 11 is made small and thus the resistance of each electrode finger may be excessively increased. The ratio (HT/R) of the height HT of the second electrode layer 11b to the length R of the lower base thereof is preferably about 0.1 to about 0.25 and more preferably about 0.1 to about 0.24, for example. If the ratio (HT/R) is too high, it may be difficult to form the IDT electrode 11. If the ratio (HT/R) is too low, the resistance of the IDT electrode 11 may be increased.

It is noted that the IDT electrode 11 configured as described above can be formed by sputtering, CVD, or the like using a resist mask.

Figure 4:
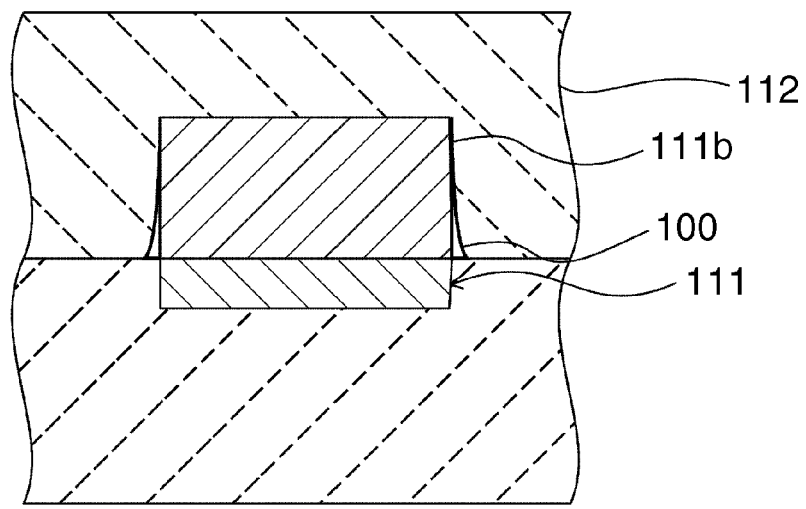
FIG. 4 is a schematic cross-sectional view of a surface acoustic wave device according to a comparative example of a preferred embodiment of the present invention.

Meanwhile, as shown in FIG. 4, when, in an IDT electrode 111, a second electrode layer 111b is not tapered toward a side opposite to a piezoelectric substrate and a cross-sectional shape of the second electrode layer 111b is rectangular or substantially rectangular, a gap 100 may be formed between the second electrode layer 111b and a dielectric layer 112.

In contrary, in the present preferred embodiment, the portion of the IDT electrode 11 which is located outside the groove 10a, namely, the second electrode layer 11b, preferably has a shape that is tapered toward the side opposite to the piezoelectric substrate 10. Thus, the vertex angles of the second electrode layer 11b are larger than 90°, and hence a gap is unlikely to be formed between the second electrode layer 11b and the dielectric film 12. Therefore, scattering of surface acoustic waves can be prevented. In addition, the effect of improving the voltage resistance and the frequency-temperature characteristics by forming the dielectric film 12 can be sufficiently obtained. As a result, high-quality resonant characteristics of the surface acoustic wave device 1 can be achieved.

Experimental Examples

Surface acoustic wave devices having different IDT electrode dimensions as shown in Table 1 below were produced by causing exposure conditions at a resist mask formation for forming an IDT electrode to be variously different from each other. As a result of observing cross sections of the produced surface acoustic wave devices with a scanning electron microscope (SEM), a surface acoustic wave device in which no gap was observed between the IDT electrode and the dielectric film was evaluated as "G", and a surface acoustic wave device in which a gap was observed between the IDT electrode and the dielectric film was evaluated as "NG".

TABLE 1

| Experimental Example | R | B | T | HT | HB | T/R | HT/R | Result |
|---|---|---|---|---|---|---|---|---|
| 1 | 0.5 | 0.48 | 0.43 | 0.12 | 0.03 | 0.86 | 0.24 | G |
| 2 | 0.5 | 0.29 | 0.43 | 0.12 | 0.15 | 0.86 | 0.24 | G |
| 3 | 0.5 | 0.34 | 0.44 | 0.08 | 0.10 | 0.88 | 0.16 | G |
| 4 | 0.5 | 0.38 | 0.46 | 0.10 | 0.10 | 0.92 | 0.2 | G |
| 5 | 0.5 | 0.49 | 0.46 | 0.12 | 0.01 | 0.92 | 0.24 | G |
| 6 | 0.5 | 0.49 | 0.47 | 0.08 | 0.01 | 0.94 | 0.16 | G |
| 7 | 0.5 | 0.50 | 0.47 | 0.08 | 0.01 | 0.94 | 0.16 | G |
| 8 | 0.5 | 0.47 | 0.47 | 0.08 | 0.03 | 0.94 | 0.16 | G |
| 9 | 0.5 | 0.38 | 0.47 | 0.08 | 0.03 | 0.94 | 0.16 | G |
| 10 | 0.5 | 0.41 | 0.47 | 0.08 | 0.05 | 0.94 | 0.16 | G |
| 11 | 0.5 | 0.50 | 0.47 | 0.08 | 0.05 | 0.94 | 0.16 | G |
| 12 | 0.5 | 0.48 | 0.48 | 0.05 | 0.01 | 0.96 | 0.1 | G |
| 13 | 0.5 | 0.35 | 0.48 | 0.05 | 0.10 | 0.96 | 0.1 | G |
| 14 | 0.5 | 0.28 | 0.49 | 0.05 | 0.15 | 0.98 | 0.1 | G |
| 15 | 0.5 | 0.49 | 0.50 | 0.08 | 0.01 | 1 | 0.16 | NG |
| 16 | 0.5 | 0.50 | 0.50 | 0.08 | 0.03 | 1 | 0.16 | NG |
| 17 | 0.5 | 0.28 | 0.50 | 0.10 | 0.10 | 1 | 0.2 | NG |
| 18 | 0.5 | 0.50 | 0.50 | 0.10 | 0.10 | 1 | 0.2 | NG |

As is clear from the result shown in the above Table 1, it appears that when T/R is made less than 1, formation of a gap between the IDT electrode and the dielectric film can be prevented.

Hereinafter, a modification of the preferred embodiment described above will be described. It is noted that in the following description, the members having functions substantially common to those in the preferred embodiment described above are designated by the common signs, and the description thereof is omitted.

First Modification

Figure 3:
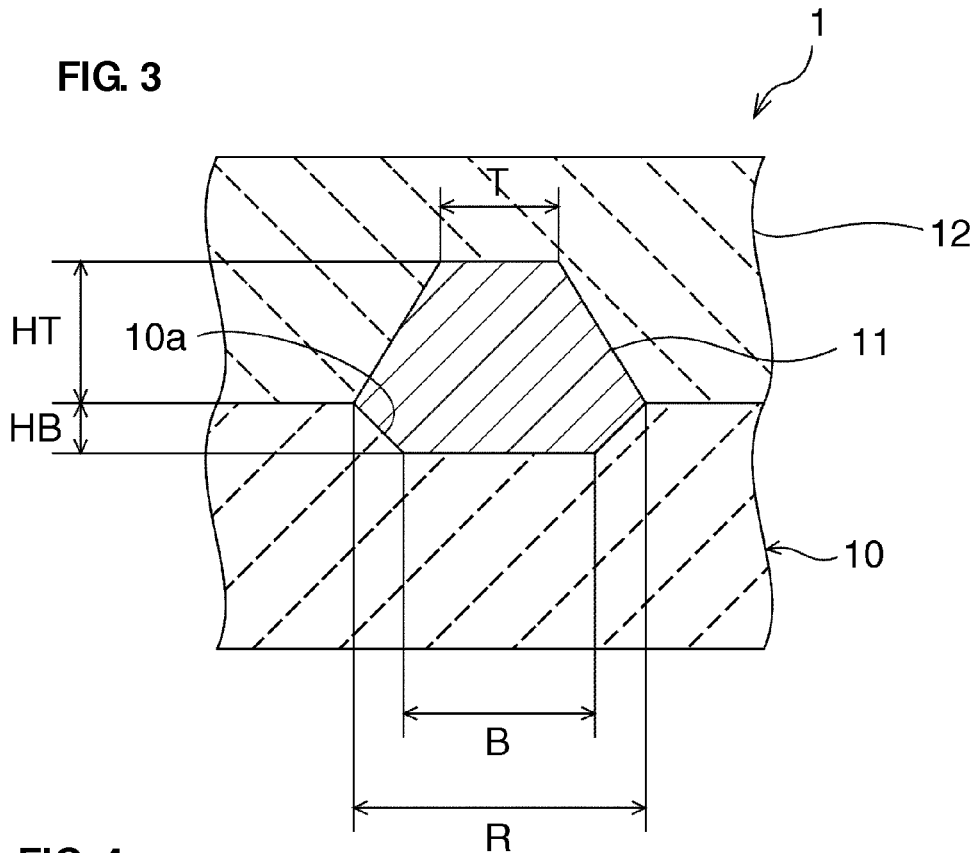
FIG. 3 is a schematic cross-sectional view of a surface acoustic wave device according to a first modification of a preferred embodiment of the present invention.

FIG. 3 is a schematic cross-sectional view of a surface acoustic wave device according to a first modification of a preferred embodiment of the present invention.

In the preferred embodiment described above, the case has been described where the IDT electrode 11 preferably includes the laminate of the first and second electrode layers 11a and 11b. However, the present invention is not limited to this configuration. For example, as shown in FIG. 3, the IDT electrode 11 may be composed of a single conductive layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate including a groove located in a surface thereof;
an IDT electrode including a first electrode layer located in the groove and a second electrode layer located outside the groove; and
a dielectric film arranged on the piezoelectric substrate so as to cover the IDT electrode; wherein
the second electrode layer is tapered toward a side opposite to the piezoelectric substrate, and
a cross-sectional shape of the second electrode layer is trapezoidal, and a ratio T/R of a length T of an upper base to a length R of a lower base in a cross section of the second electrode layer is within a range of about 0.86 to about 0.98.

2. The surface acoustic wave device according to claim 1, wherein the first electrode layer is tapered toward the piezoelectric substrate side.

3. The surface acoustic wave device according to claim 1, wherein a ratio HT/R of a height HT to the length R of the lower base in the cross section of the second electrode layer is within a range of about 0.1 to about 0.25.

4. The surface acoustic wave device according to claim 2, wherein a ratio HT/R of a height HT to the length R of the lower base in the cross section of the second electrode layer is within a range of about 0.1 to about 0.25.

5. The surface acoustic wave device according to claim 1, wherein the dielectric film is made of silicon oxide or silicon nitride.

* * * * *